United States Patent
Lee et al.

(10) Patent No.: US 9,788,433 B2
(45) Date of Patent: Oct. 10, 2017

(54) CIRCUIT BOARD AND METHOD OF MANUFACTURING THE SAME

(71) Applicant: SAMSUNG ELECTRO-MECHANICS CO., LTD., Suwon-si (KR)

(72) Inventors: Doo Hwan Lee, Daejeon (KR); Yul Kyo Chung, Yongin-si (KR); Yee Na Shin, Suwon-si (KR); Seung Eun Lee, Sungnam-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/074,209

(22) Filed: Mar. 18, 2016

(65) Prior Publication Data
US 2016/0205773 A1    Jul. 14, 2016

Related U.S. Application Data

(62) Division of application No. 14/143,682, filed on Dec. 30, 2013, now abandoned.

(30) Foreign Application Priority Data

Dec. 31, 2012    (KR) .................. 10-2012-0158340

(51) Int. Cl.
*H05K 1/18*    (2006.01)
*H05K 1/03*    (2006.01)
(Continued)

(52) U.S. Cl.
CPC ............. *H05K 3/002* (2013.01); *H01L 24/19* (2013.01); *H01L 24/24* (2013.01); *H01L 24/82* (2013.01);
(Continued)

(58) Field of Classification Search
CPC ...... H05K 1/0231; H05K 1/162; H05K 1/306; H01L 2924/19041
(Continued)

(56) References Cited

U.S. PATENT DOCUMENTS 6,237,218 B1 *    5/2001    Ogawa .................. H05K 3/4638
                                                174/254
2011/0147055 A1 *    6/2011    Ma ...................... H01L 21/4803
                                                174/255
(Continued)

FOREIGN PATENT DOCUMENTS

CN    101288350 B    11/2012
JP    6-232528 A    8/1994
(Continued)

OTHER PUBLICATIONS

Korean Office Action dated Dec. 24, 2013 in counterpart Korean Patent Application No. 10-2012-0158340.
(Continued)

*Primary Examiner* — Hoa C Nguyen
(74) *Attorney, Agent, or Firm* — NSIP Law

(57) ABSTRACT

A circuit board includes an inorganic material insulating layer, a first circuit pattern layer formed on a surface of the inorganic material insulating layer, a first build-up insulating layer formed on the inorganic material insulating layer and formed of an organic material, and a second circuit pattern layer formed on a surface of the first build-up insulating layer.

8 Claims, 14 Drawing Sheets

(51) Int. Cl.
H05K 3/00 (2006.01)
H05K 1/02 (2006.01)
H05K 1/11 (2006.01)
H05K 3/46 (2006.01)
H01L 23/00 (2006.01)

(52) U.S. Cl.
CPC ......... *H05K 1/0271* (2013.01); *H05K 1/0298* (2013.01); *H05K 1/0306* (2013.01); *H05K 1/115* (2013.01); *H05K 1/185* (2013.01); *H05K 3/4605* (2013.01); *H05K 3/4697* (2013.01); *H01L 2224/12105* (2013.01); *H01L 2224/24227* (2013.01); *H01L 2224/92244* (2013.01); *H01L 2924/12042* (2013.01); *H01L 2924/15153* (2013.01); *H01L 2924/15311* (2013.01); *H05K 3/4644* (2013.01); *H05K 2201/10015* (2013.01); *H05K 2203/1469* (2013.01); *Y10T 29/4913* (2015.01)

(58) Field of Classification Search
USPC ................... 361/760–764; 174/260–262
See application file for complete search history.

(56) References Cited

U.S. PATENT DOCUMENTS

| 2012/0188734 | A1  | 7/2012 | Mikado et al. |
| 2013/0194764 | A1* | 8/2013 | Mikado ............... H05K 1/185 |
| | | | 361/761 |
| 2014/0062607 | A1* | 3/2014 | Nair .................... H01L 25/16 |
| | | | 331/68 |

FOREIGN PATENT DOCUMENTS

| JP | 2000-261124 A    | 9/2000  |
| JP | 2004-79736 A     | 3/2004  |
| KR | 10-2008-0079384 A | 9/2008  |
| KR | 10-2009-0062709 A | 6/2009  |
| KR | 10-1095161 B1    | 12/2011 |
| KR | 10-2012-0137201 A | 12/2012 |
| TW | 573444 B         | 1/2004  |
| TW | I325745 B        | 6/2010  |

OTHER PUBLICATIONS

Korean Office Action dated Jun. 20, 2014 in counterpart Korean Patent Application No. 10-2014-0034156.
Taiwanese Office Action dated Mar. 17, 2016 in counterpart Taiwanese Application No. 102143673. (15 pages in Chinese with English abstract).

* cited by examiner

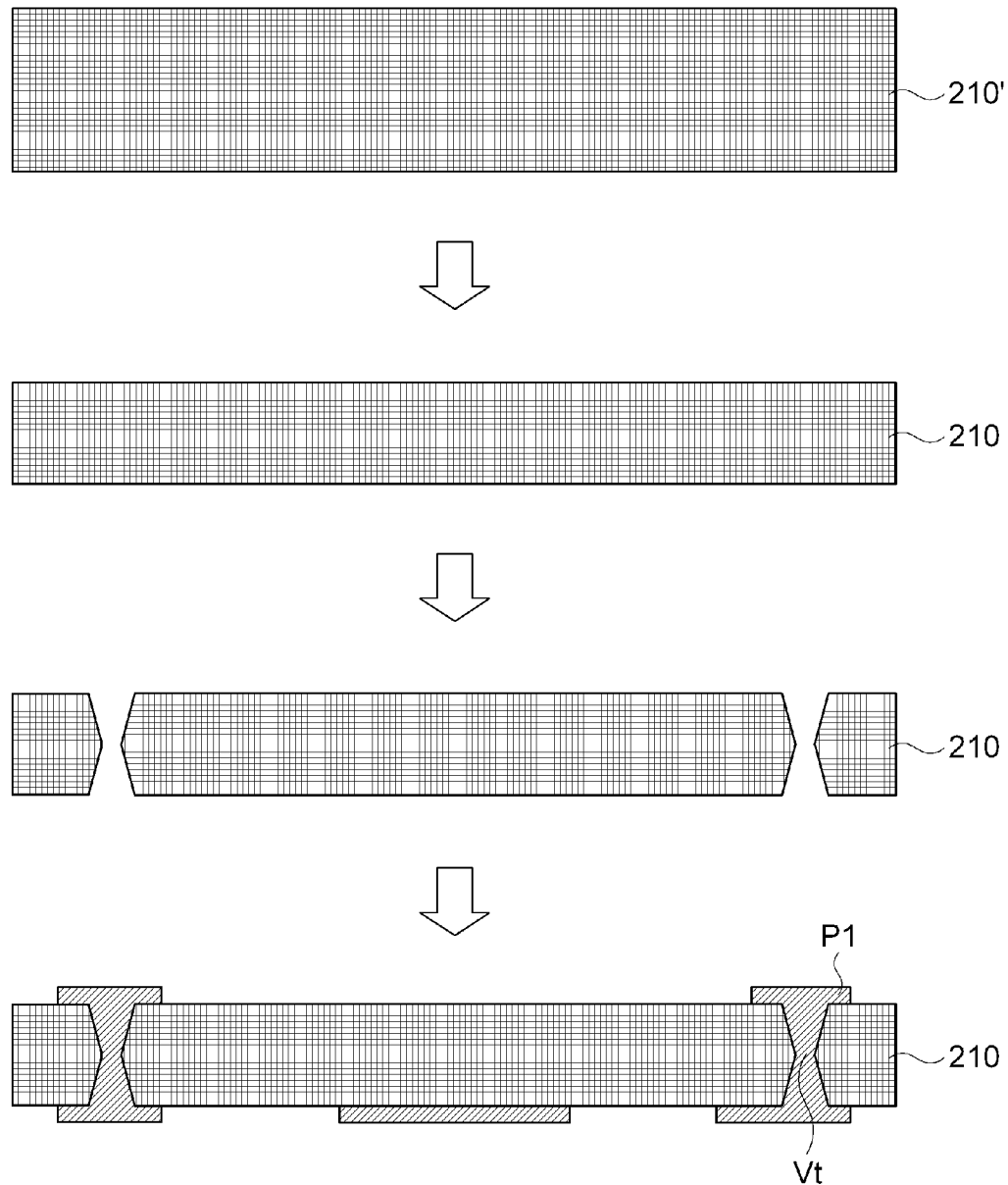

CIRCUIT BOARD AND METHOD OF MANUFACTURING THE SAME

CROSS-REFERENCE TO RELATED APPLICATIONS

This application is a divisional of U.S. patent application Ser. No. 14/143,682 filed on Dec. 30, 2013, which claims the foreign priority benefit of Korean Patent Application No. 10-2012-0158340 filed with the Korea Intellectual Property Office on Dec. 31, 2012, the entire disclosure of which is incorporated herein by reference for all purposes.

BACKGROUND

1. Field

Embodiments of the present invention relate to a circuit board and a method of manufacturing the same.

2. Description of the Related Art

In order to deal with a light weight, a small size, a high speed, a multiple functions, and high performance of electronic appliances, multi-layered substrate techniques in which a plurality of interconnection layers are formed on a printed circuit board (PCB) are developed, and further, a technique of mounting electronic components such as an active device or a passive device into a multi-layered substrate is also developed.

Meanwhile, one of important tasks in a multi-layered substrate field may be that built-in electronic components effectively transmit and receive a signal including a voltage or current to/from an external circuit or other devices.

In addition, as tendency for high performance of electronic components, a small size and thinning of electronic components and electronic components-built-in substrate is intensified, in order to mount small electronic components into a smaller and thinner substrate and connect external electrodes of the electronic components to the outside, improvement in integrity of a circuit pattern is necessarily needed.

Meanwhile, as the electronic components-built-in substrate is further thinned, a bending phenomenon of the substrate becomes a serious problem. Such a bending phenomenon may be referred to as warpage, which becomes serious as the electronic components-built-in substrate is formed of various materials having different thermal expansion coefficients.

Document 1 cited below discloses a multi-layered substrate constituted by an insulating layer formed on a glass ceramic material only, and Document 2 cited below discloses a conventional multi-layered substrate in which a core substrate is formed by coating or impregnating a glass core or a glass fiber with resin.

However, when the insulating layer is implemented by the glass ceramic material only like in Document 1, since a process of processing a via and a circuit pattern is very difficult, it is difficult to implement a fine and highly integrated circuit pattern, and it is difficult to secure adhesion reliability between layers.

In addition, even in the case of a core in which the glass core or glass fiber is impregnated with resin like in Patent Document 2, sufficient strength cannot be secured to cause limitation in reduction of warpage.

CITATIONS (Document 1) Japanese Patent Application Laid-Open No. 1994-232528
(Document 2) Japanese Patent Application Laid-Open No. 2000-261124

SUMMARY

Embodiments of the present invention have been invented in order to overcome the above-described problems and it is, therefore, an aspect of the present invention is to provide a circuit board and a method of manufacturing the same that are capable of reducing warpage of the circuit board and improving manufacturing efficiency thereof.

In accordance with one aspect of the present invention to achieve the above mentioned capabilities, there is provided a circuit board including: an inorganic material insulating layer; a first circuit pattern layer formed on a surface of the inorganic material insulating layer; a first build-up insulating layer formed on the inorganic material insulating layer and formed of an organic material; and a second circuit pattern layer formed on a surface of the first build-up insulating layer.

Here, the inorganic material insulating layer may be a glass sheet or a plate glass.

In addition, the circuit board may further include a recess section formed at one region of the inorganic material insulating layer, and an electronic component at least partially inserted into the recess section and having an external electrode at at least one surface thereof, wherein the first build-up insulating layer covers the electronic components.

Here, the first build-up insulating layer may include a first upper build-up insulating layer formed on the inorganic material insulating layer and a first lower build-up insulating layer formed under the inorganic material insulating layer.

In addition, the number of build-up layers formed on the first upper build-up insulating layer may be different from the number of build-up layers formed on the first lower build-up insulating layer.

Here, the external electrode may be disposed in a direction of the first upper build-up insulating layer, and the number of build-up layers formed on the first upper build-up insulating layer may be larger than that of the build-up layers formed on the first lower build-up insulating layer.

Meanwhile, the first circuit pattern layers may be formed on both surfaces of the inorganic material insulating layer, and may be electrically connected to each other by a via passing through the inorganic material insulating layer.

In addition, the circuit board may further include at least one build-up layer on the first build-up insulating layer.

Further, the inorganic material insulating layer may include a first inorganic material insulating layer having a cavity; an adhesive layer adhered to a lower surface of the first inorganic material insulating layer; and a second inorganic material insulating layer adhered to a lower surface of the adhesive layer.

Furthermore, the circuit board may further include a cavity passing through the inorganic material insulating layer and formed in one region of the inorganic material insulating layer, and an electronic component at least partially inserted into the cavity and having an external electrode formed at at least one surface thereof, wherein the first build-up insulating layer covers the electronic component.

Here, the electronic component may be a capacitor.

A circuit board according to an embodiment of the present invention includes an inorganic material insulating layer having a cavity or a recess section; an identification mark formed on a surface of the inorganic material insulating layer; an electronic component partially inserted into the cavity or the recess section and having an external electrode at at least one surface thereof; a first build-up insulating layer formed on the inorganic material insulating layer and formed of an organic material; and a second circuit pattern layer formed on a surface of the first build-up insulating layer.

Here, the inorganic material insulating layer may be a glass sheet or plate glass.

In addition, the first build-up insulating layer may include a first upper build-up insulating layer formed on the inorganic material insulating layer and a first lower build-up insulating layer formed on the inorganic material insulating layer, the second circuit pattern layer may include a second upper circuit pattern layer formed on an upper surface of the first upper build-up insulating layer and a second lower circuit pattern layer formed on an upper surface of the first lower build-up insulating layer, and the second upper circuit pattern layer and the second lower circuit pattern layer may be electrically connected by a via passing through the first build-up insulating layer and the inorganic material insulating layer.

Further, the via may pass through the identification mark.

Furthermore, the external electrode may be electrically connected to any one of the second upper circuit pattern layer and the second lower circuit pattern layer by the via.

In addition, the external electrode may be disposed in a direction of the first upper build-up insulating layer, and the number of build-up layers formed on the first upper build-up insulating layer may be larger than that of build-up layers formed on the first lower build-up insulating layer.

Here, the electronic component may be a capacitor.

A method of manufacturing a circuit board according to an embodiment of the present invention includes: forming a first circuit pattern layer on a surface of an inorganic material insulating layer; forming a recess section or a cavity in the inorganic material insulating layer; inserting at least a portion of an electronic component having an external electrode into the recess section or the cavity; forming a first build-up insulating layer formed of an organic material on the inorganic material insulating layer; forming a via-hole passing the first build-up insulating layer and configured to expose a surface of at least one of the first circuit pattern layer and the external electrode; and forming a conductive material in the via-hole and forming a second circuit pattern layer on a surface of the first build-up insulating layer.

Here, forming a recess section or a cavity in the inorganic material insulating layer may include forming a resist pattern configured to expose a region at which the recess section or the cavity is to be formed on the inorganic material insulating layer; and wet-etching the exposed region to form the recess section or the cavity and then removing the resist pattern.

In addition, the first build-up insulating layer may include a first upper build-up insulating layer formed on the inorganic material insulating layer and a first lower build-up insulating layer formed under the inorganic material insulating layer, the method may further include forming at least one build-up layer on the first upper build-up insulating layer and the first lower build-up insulating layer, and wherein the number of build-up layers formed on the first upper build-up insulating layer is different from the number of build-up layers formed on the first lower build-up insulating layer.

Further, inserting at least the portion of the electronic component having the external electrode into the recess section or the cavity may be performed by making the lower surface of the electronic components in contact with the adhesive layer and adhering an added inorganic material insulating layer to the adhesive layer lower surface in a state in which an adhesive layer is adhered to the lower surface of the inorganic material insulating layer having the cavity.

Furthermore, the method may further include performing at least one pre-treatment process selected from surface etching, hardening and opaque processing to the inorganic material insulating layer.

A method of manufacturing a circuit board according to an embodiment of the present invention includes forming an identification mark on a surface of an inorganic material insulating layer; forming a recess section or a cavity in the inorganic material insulating layer; inserting at least a portion of an electronic component having an external electrode into the recess section or the cavity; forming a first build-up insulating layer formed of an organic material on the inorganic material insulating layer; forming a via-hole passing through the first build-up insulating layer and configured to expose a surface of the external electrode; and forming a conductive material in the via-hole and forming a second circuit pattern layer on a surface of the first build-up insulating layer.

Here, forming the recess section or the cavity in the inorganic material insulating layer may include patterning a predetermined region with respect to the identification mark.

In addition, inserting at least the portion of the electronic component having the external electrode into the recess section or the cavity may be performed by mounting the electronic component on a predetermined position with respect to the identification mark.

Further, forming the via-hole passing through the first build-up insulating layer and configured to expose a surface of the external electrode may include forming a via-hole passing through the first build-up insulating layer, the identification mark and the inorganic material insulating layer.

Furthermore, the first build-up insulating layer may include a first upper build-up insulating layer formed on the inorganic material insulating layer and a first lower build-up insulating layer formed under the inorganic material insulating layer, the method may further include forming at least one build-up layer on the first upper build-up insulating layer and the first lower build-up insulating layer, wherein the number of build-up layers formed on the first upper build-up insulating layer is different from the number of build-up layers formed on the first lower build-up insulating layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 3A to 3D are cross-sectional process views schematically showing a method of manufacturing the circuit board according to the embodiment also illustrated in FIG.

Figure 3B:
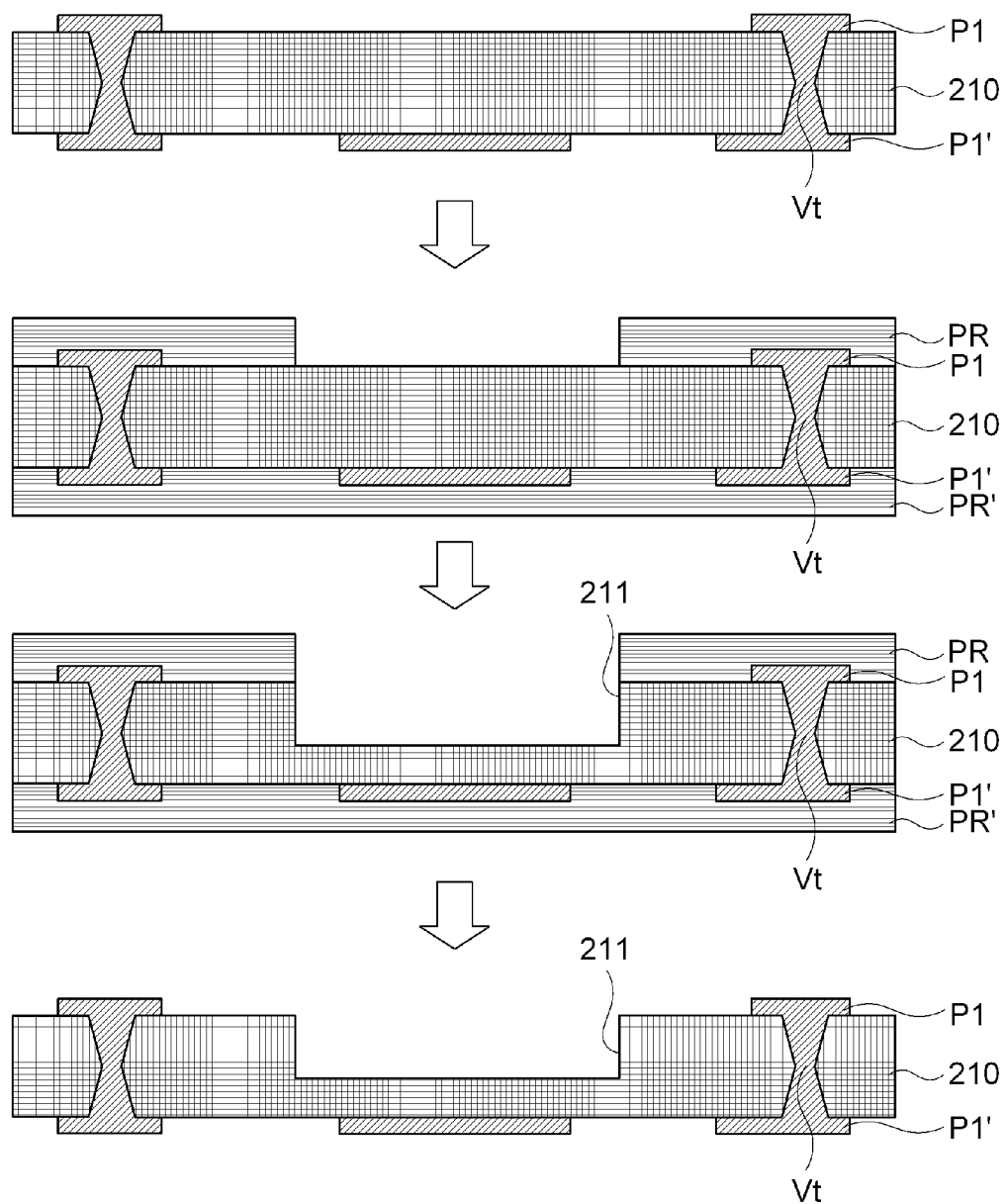
Figure 3C:
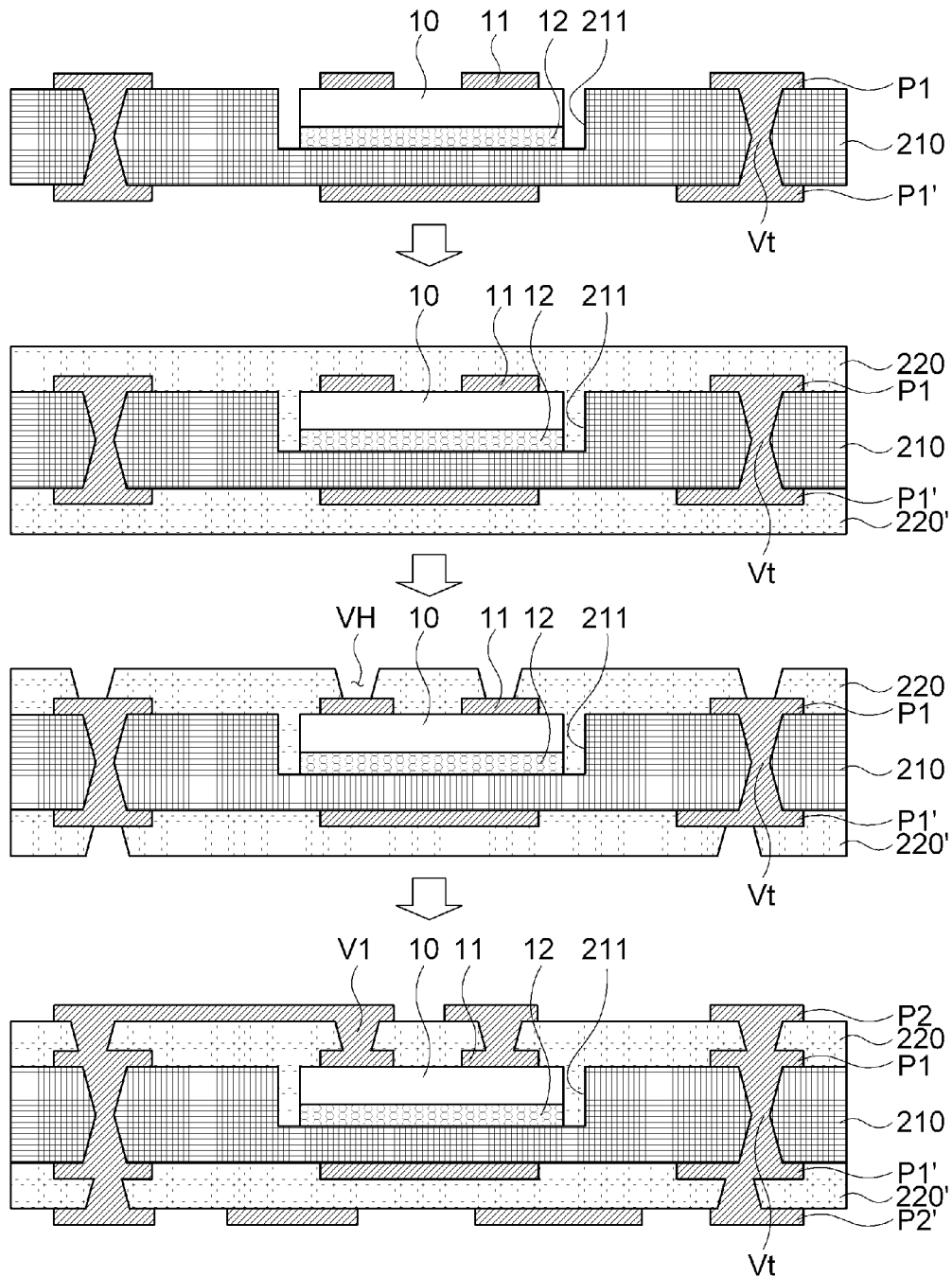
Figure 3D:
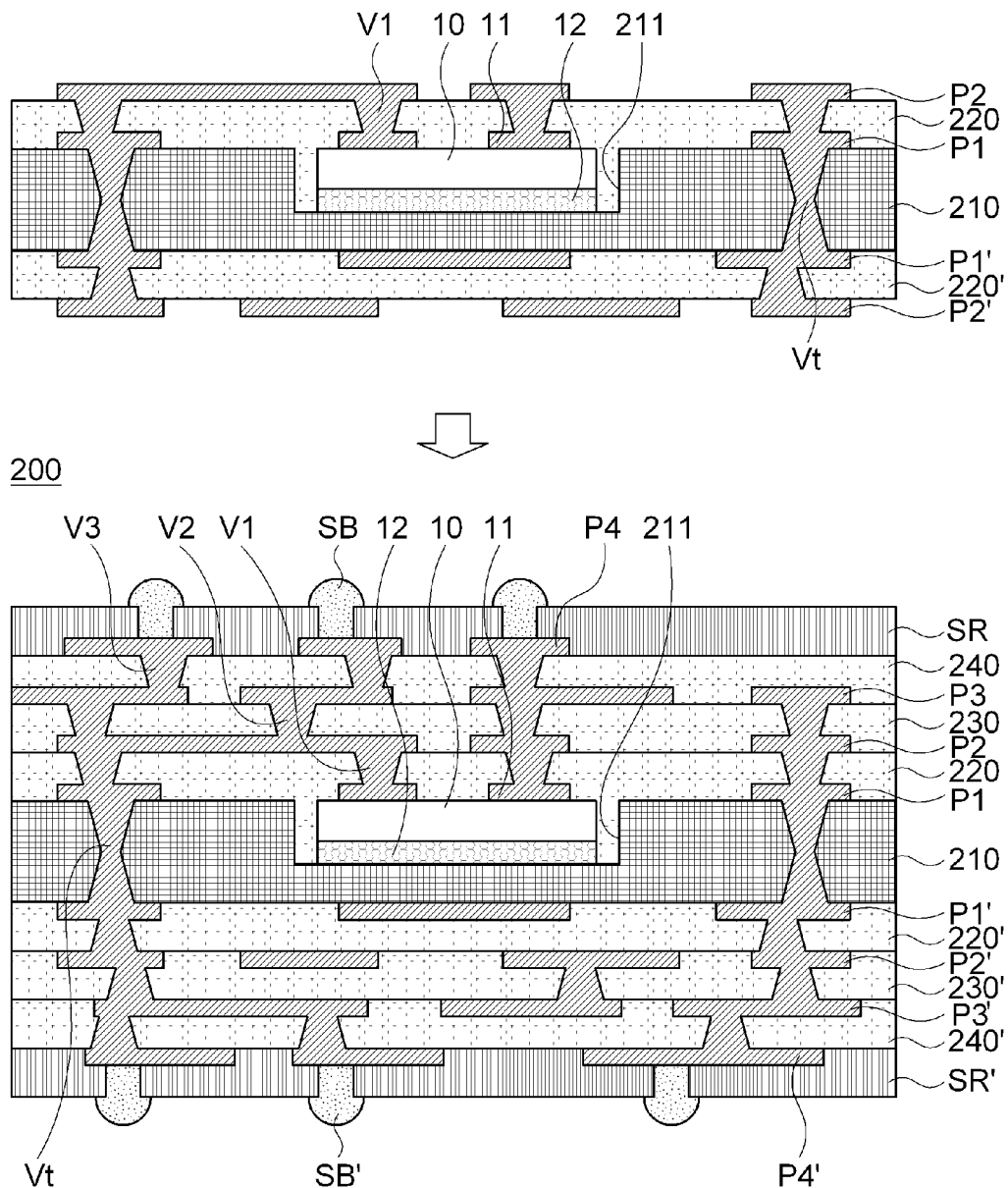
Figure 4:
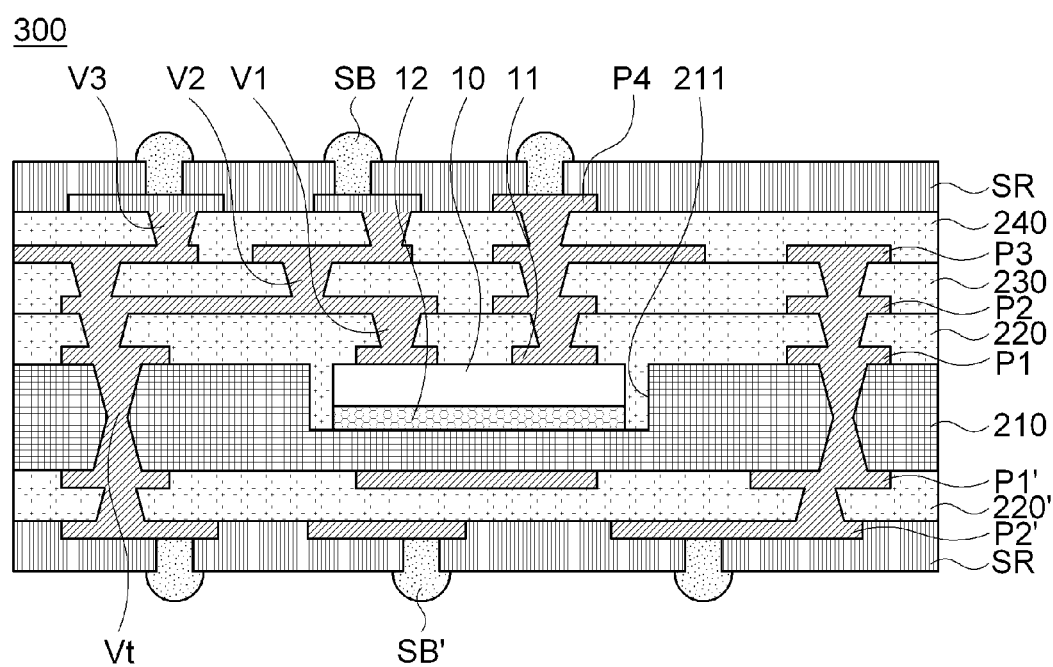
Figure 5:
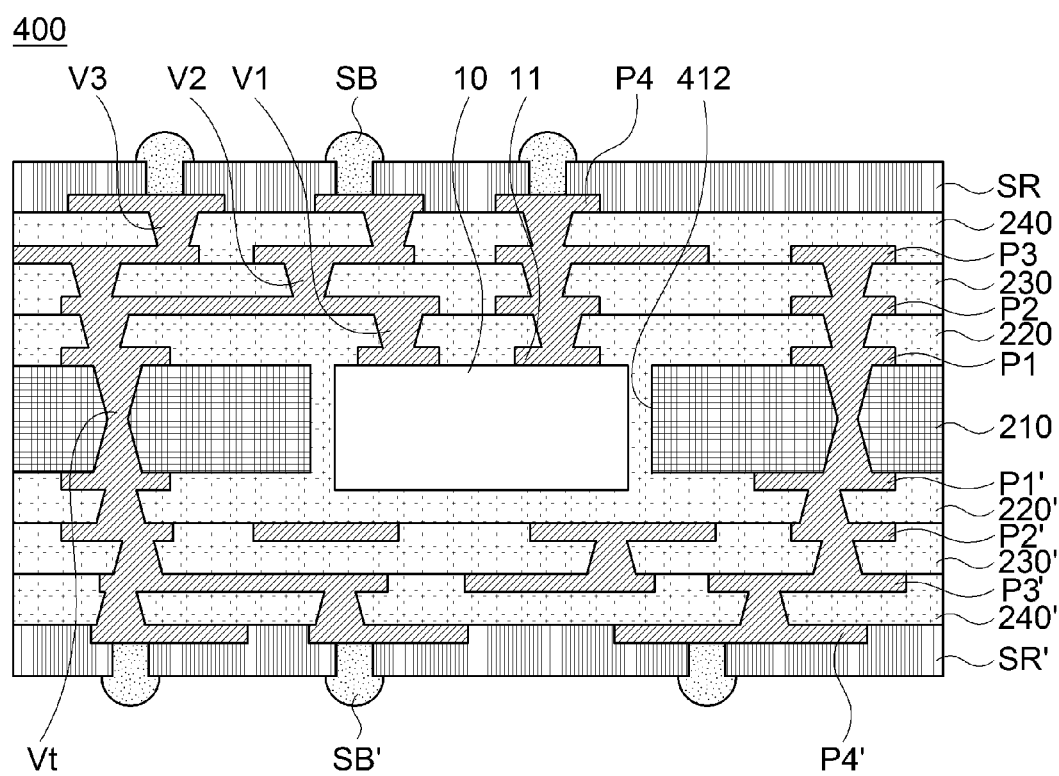
Figure 6:
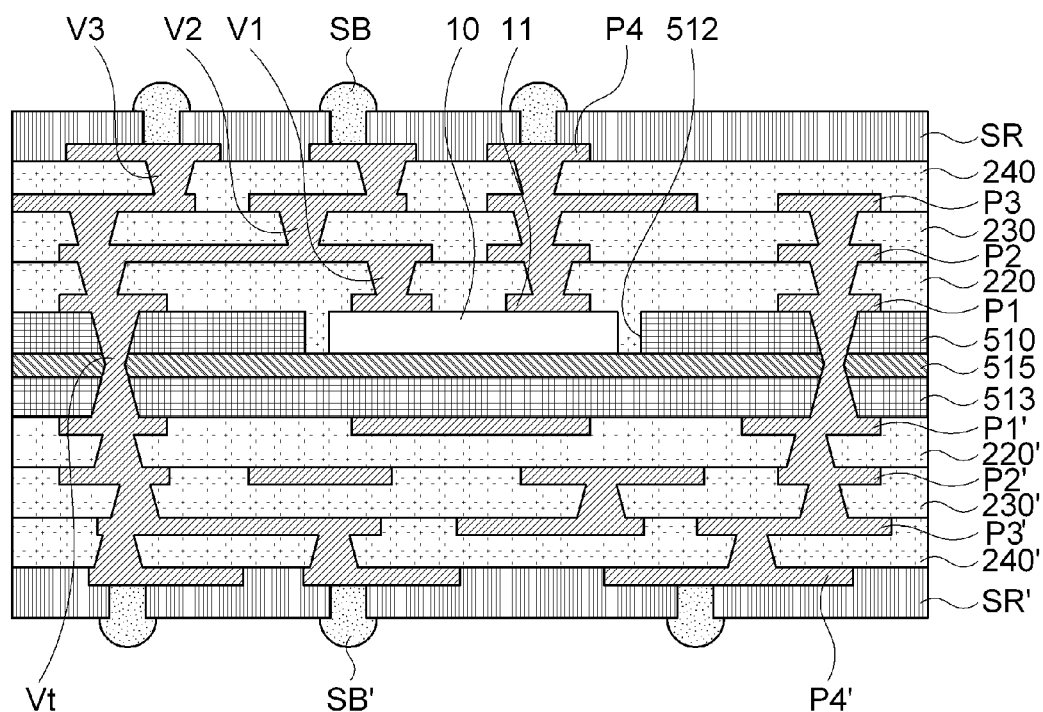
Figure 7:
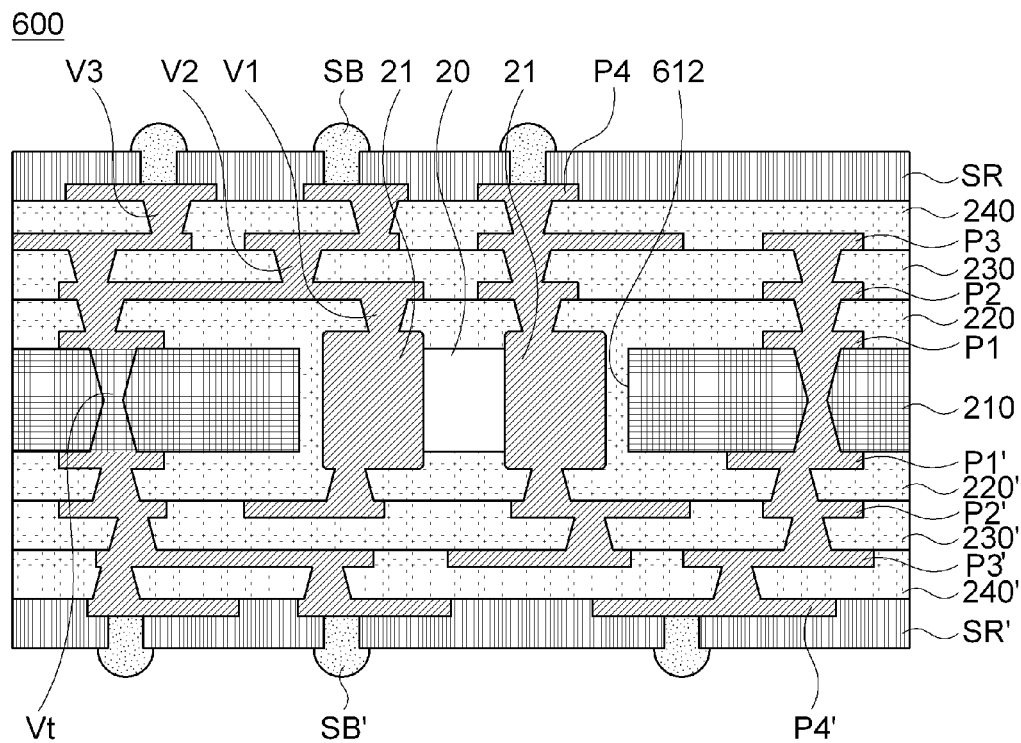
Figure 8:
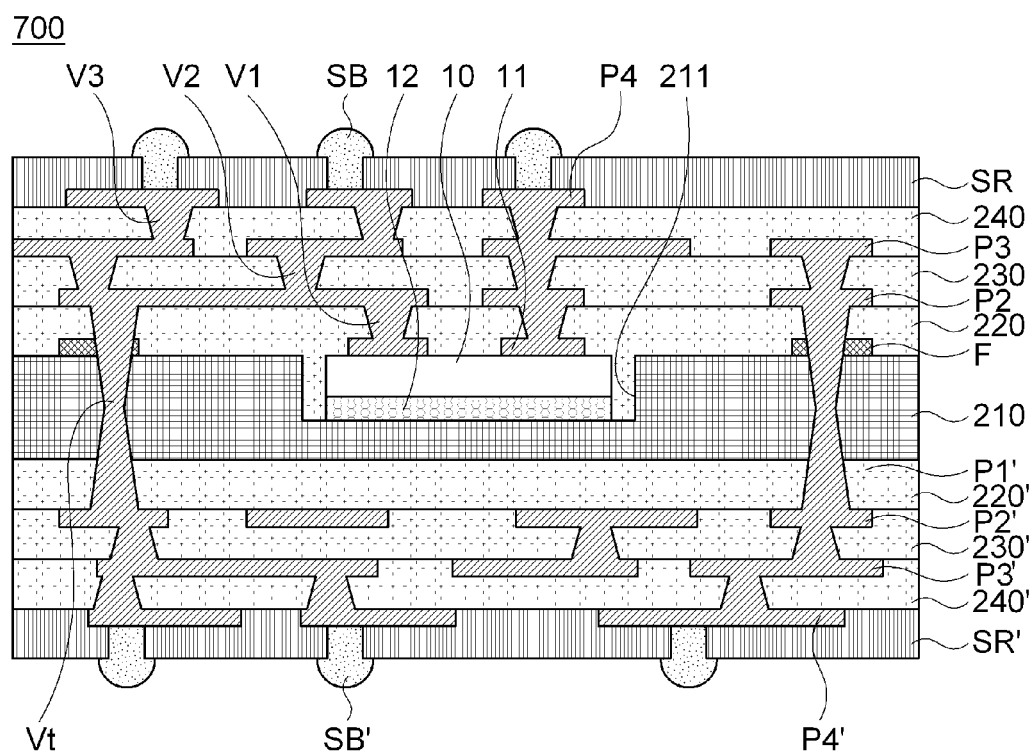
Figure 9A:
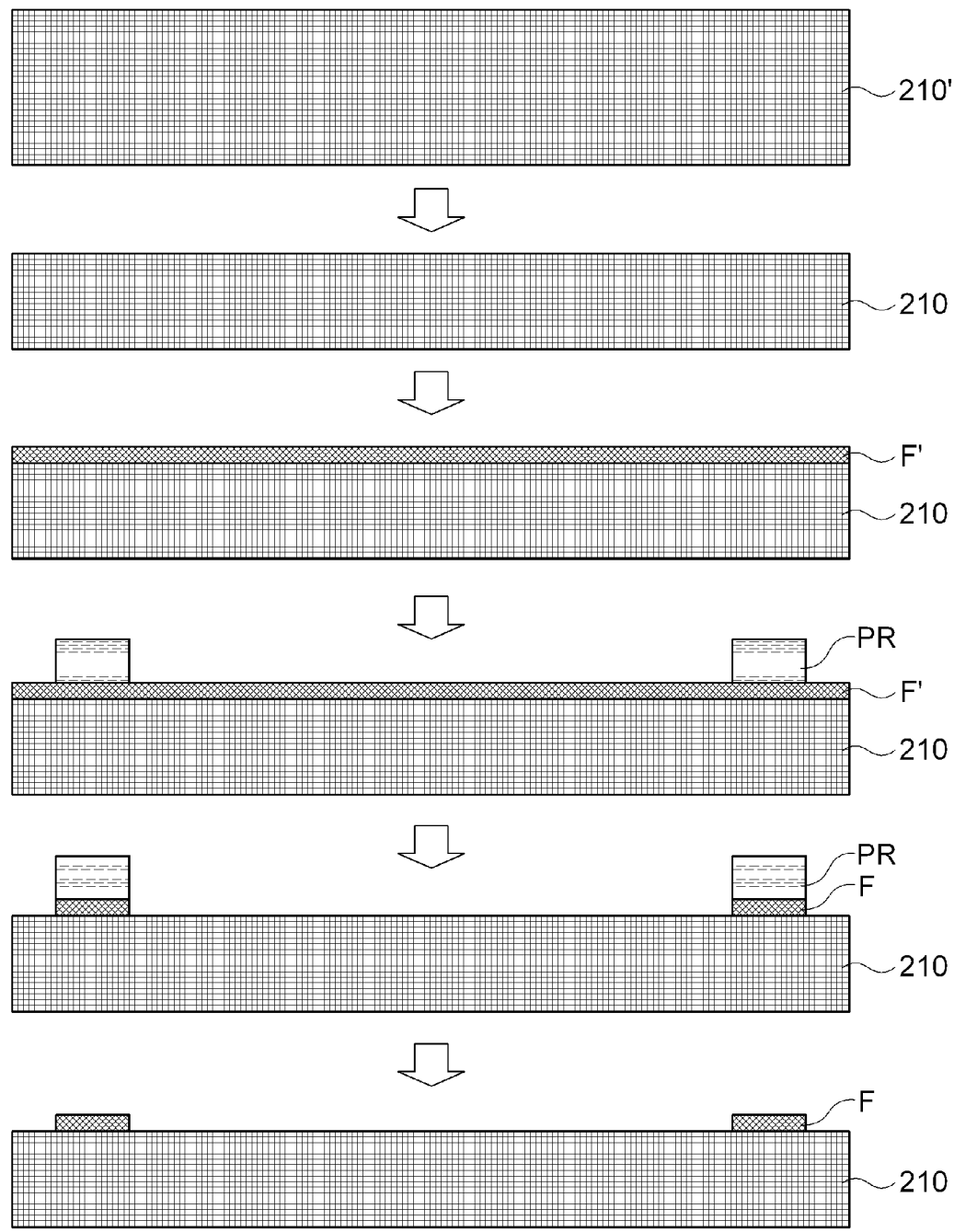
Figure 9B:
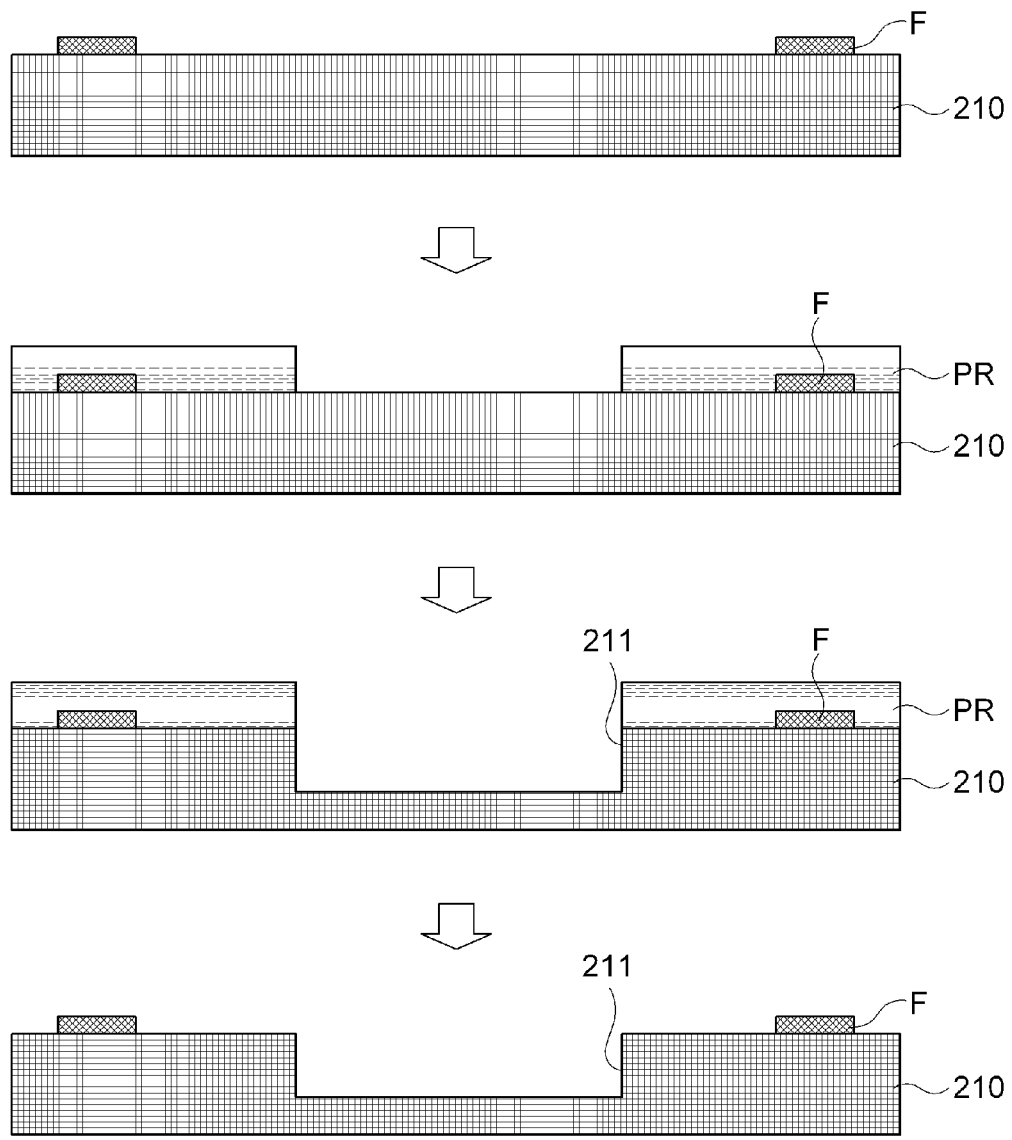
Figure 9C:
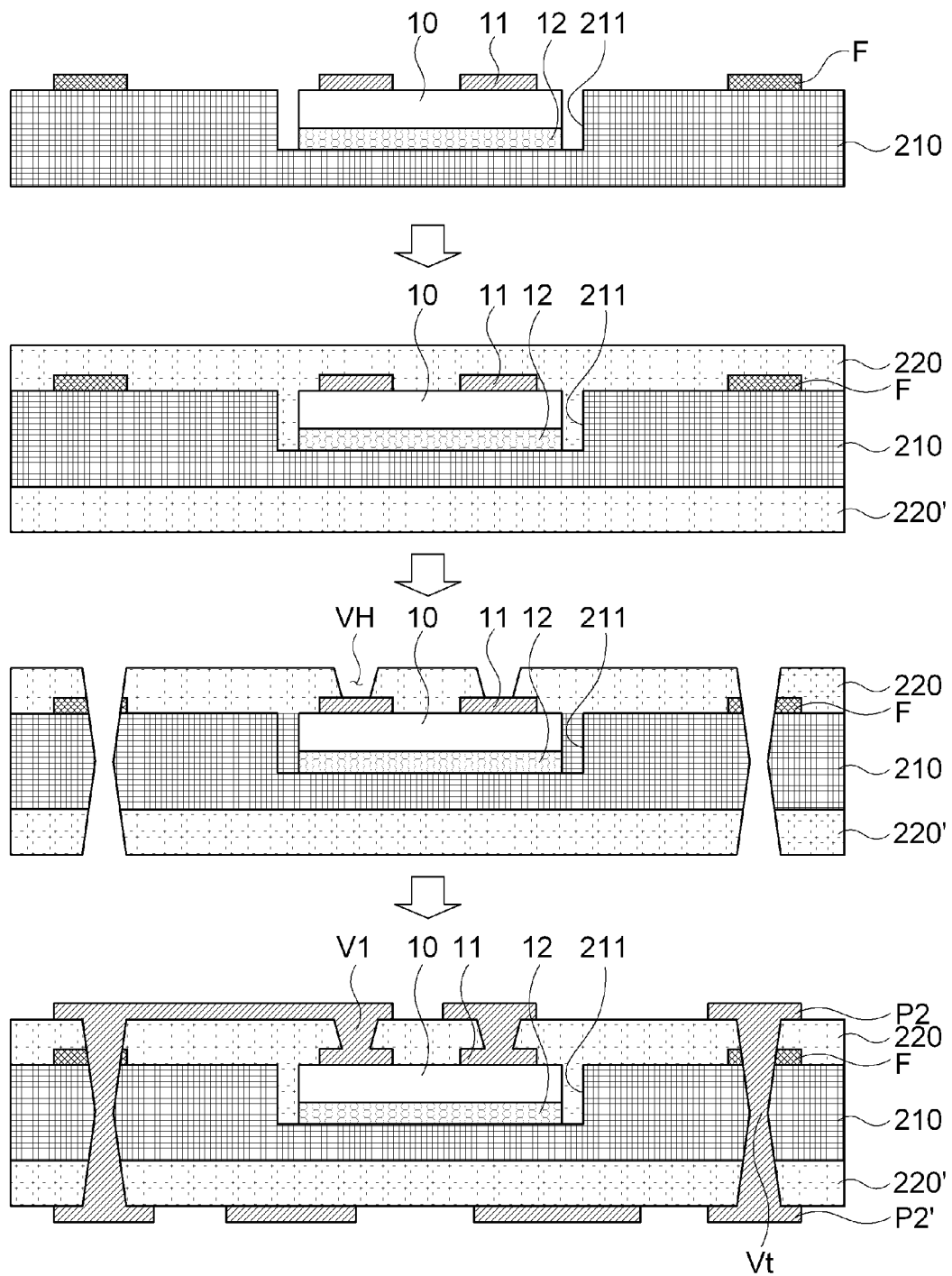
Figure 9D:
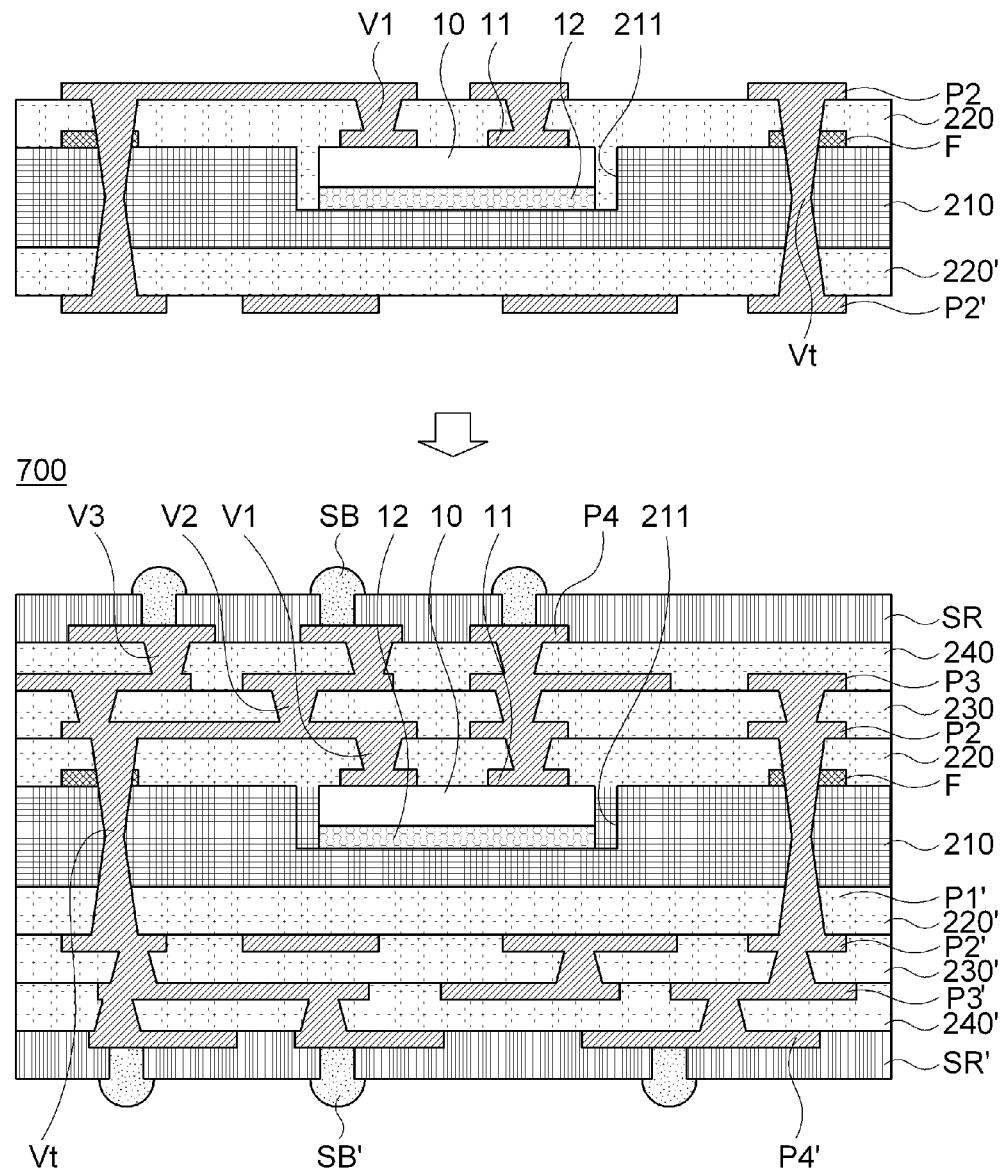

2, FIG. 3A showing a process of forming a first circuit pattern layer on an inorganic material insulating layer, FIG. 3B showing a process of forming a recess section in the inorganic material insulating layer, FIG. 3C showing a process of mounting electronic components and forming a first build-up insulating layer, and FIG. 3D showing a process of further forming a build-up layer;

FIG. 4 is a cross-sectional view schematically showing a circuit board according to another embodiment of the present invention;

FIG. 5 is a cross-sectional view schematically showing a circuit board according to another embodiment of the present invention;

FIG. 6 is a cross-sectional view schematically showing a circuit board according to a another embodiment of the present invention;

FIG. 7 is a cross-sectional view schematically showing a circuit board according to another embodiment of the present invention;

FIG. 8 is a cross-sectional view schematically showing a circuit board according to another embodiment of the present invention; and FIG. 9A to 9D are cross-sectional process views schematically showing the circuit board according to the embodiment also illustrated in FIG. 8, FIG. 9A showing a process of forming an identification mark on an inorganic material insulating layer, FIG. 9B showing a process of forming a recess section in the inorganic material insulating layer, FIG. 9C showing a process of mounting electronic components and forming a first build-up insulating layer, and FIG. 9D showing a process of further forming a build-up layer.

DESCRIPTION OF EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

Terms used herein are provided for explaining embodiments of the present invention, not limiting the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, motions, and/or devices, but do not preclude the presence or addition of one or more other components, motions, and/or devices thereof.

For the purpose of simplification and clarification of illustration, the drawings show conventional configurations, and known characteristics and detailed description of techniques may be omitted to avoid description of the embodiments from becoming unnecessary unclear. Additionally, components of the drawings are not necessarily drawn according to their scales. For example, sizes of some components of the drawings may be exaggerated for the convenience of understanding of the present invention. Like reference numerals in different drawings designate like element, and similar reference numerals may designate similar elements, not necessarily so.

It will be understood that, although the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present invention. Similarly, when it is described that a method includes series of steps, a sequence of the steps is not a sequence in which the steps should be performed in the sequence, an arbitrary technical step may be omitted and/or another arbitrary step, which is not disclosed herein, may be added to the method.

It will be understood that when terms "left," "light," "front," "rear," "on," "under," "over," "beneath" or the like are used, the terms are merely used for the purpose of description, not describing unchangeable relative positions. The terms used herein may be exchangeable to be operated in different directions than shown and described herein under an appropriate environment. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Here, the phrase "in one embodiment" means the same embodiment, not necessarily so.

Hereinafter, configurations and effects of the present invention will be described in detail with reference to the accompanying drawings.

Figure 1:
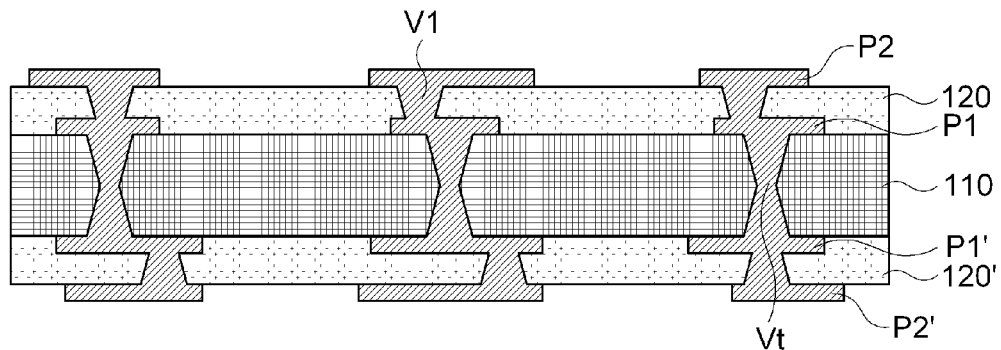
FIG. 1 is a cross-sectional view schematically showing a circuit board according to an embodiment of the present invention.

FIG. 1 is a cross-sectional view schematically showing a circuit board 100 according to an embodiment of the present invention.

Referring to FIG. 1, the circuit board 100 according to an embodiment of the present invention may include an inorganic material insulating layer 110, a first circuit pattern layer P1, a first build-up insulating layer 120 and a second circuit pattern layer P2.

The inorganic material insulating layer 110 may be formed of glass. Here, the glass may be a glass plate such as a glass sheet or a plate glass produced by a glass manufacturer. For example, the glass may be formed of various kinds of glass materials such as a willow, Gorilla (which are trademarks, manufactured by Corning Corporation), Lime Soda, a plate glass used in a liquid crystal display (LCD), or the like. In exemplary embodiments of the present invention, impurities or additives may be partially mixed with the glass to improve properties.

According to the exemplary embodiments, the inorganic material insulating layer 110 may function as a core substrate. In this case, since good stiffness, modulus, and tensile strength can be secured in comparison with the case in which a conventional resin or a resin impregnated with glass fiber is used as the core substrate, a warpage phenomenon of the circuit board can be basically solved.

Here, various kinds of glass materials such as willow, LCD, Gorilla, Lime Soda, or the like, may be applied as the glass.

Next, the first circuit pattern layer P1 may be directly formed on a surface of the inorganic material insulating layer 110.

Here, the first circuit pattern layer P1, P1' may be formed at both surfaces of the inorganic material insulating layer 110, and the first circuit pattern layer P1 formed on one surface of the inorganic material insulating layer 110 may be electrically connected to the first circuit pattern layer P1' formed on the other surface of the inorganic material insulating layer 110 through a through-via Vt passing through the inorganic material insulating layer 110.

Next, the first build-up insulating layer 120 may be formed of an organic material.

For example, the first build-up insulating layer 120 may be formed of epoxy resin. In one embodiment, the first build-up insulating layer 120 may include ABF. According to the exemplary embodiments of the present invention, the organic material does not exclude that an additive such as filler is included in an organic composition such as resin. And a second circuit pattern layer P2 may be directly formed on a surface of the first build-up insulating layer 120.

According to the exemplary embodiments, since the warpage of the circuit board 100 is basically blocked by the inorganic material insulating layer 110, even when an insulating material including a core material such as prepreg is not used as a build-up insulating layer, sufficient mechanical and physical characteristics of the circuit board can be secured. Accordingly, as the organic material is used as the build-up insulating layer, a circuit pattern having a finer pitch or line width can be formed.

Here, the first build-up insulating layer 120, 120' may also be formed on and under the inorganic material insulating layer 110, a layer formed on the inorganic material insulating layer 110 may be referred to as a first upper build-up insulating layer 120, and a layer formed under the inorganic material insulating layer 110 may be referred to as a first lower build-up insulating layer 120'.

Accordingly, the circuit board 100 according to an embodiment of the present invention includes the inorganic material insulating layer 110 to enable reduction in warpage in comparison with the conventional art and effective implement of a via and circuit pattern on the first build-up insulating layer 120 formed of an organic material.

Accordingly, while reduction in warpage is limited in the case of the conventional multi-layered substrate formed of the organic material only, the circuit board 100 according to the embodiment of the present invention can solve the problem.

In addition, when the conventional multi-layered substrate in which the entire substrate is formed of glass, a process of processing the via and circuit pattern is very difficult and adhesion reliability between layers cannot be easily secured, and such problems cannot be solved by the circuit board 100 according to the embodiment of the present invention.

Figure 2:
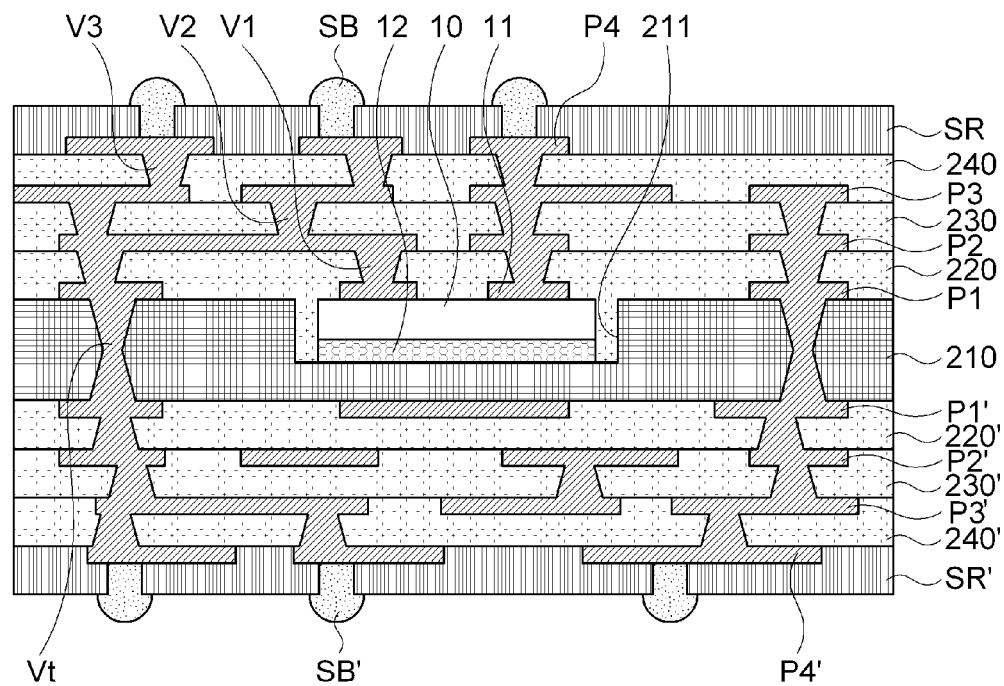
FIG. 2 is a cross-sectional view schematically showing a circuit board according to another embodiment of the present invention.

FIG. 2 is a cross-sectional view schematically showing a circuit board 200 according to another embodiment of the present invention.

Referring to FIG. 2, the circuit board 200 according to the embodiment includes an electronic component 10 mounted therein.

Here, a recess section 211 recessed in a groove shape is formed in one region of an inorganic material insulating layer 210 such that the electronic component 10 is seated in the recess section 211. Of course, it will be easily understood to those skilled in the art that the entire electronic component 10 should not be inserted into the recess section 211.

In addition, the electronic component 10 may be an active device such as a semiconductor chip or a passive device such as a capacitor, and an external electrode 11 is installed at the outside thereof.

In particular, in the embodiment in which the electronic component 10 is seated in the recess section 211, a surface the electrode 10 at which the external electrode 11 is formed may be disposed in a direction opposite to a bottom surface of the recess section 211 such that the external electrode 11 of the electronic component 10 forms electrical connection to the outside of the circuit board 200.

Meanwhile, the first build-up insulating layer 220 formed of the organic material may be provided on the inorganic material insulating layer 210 to cover the inorganic material insulating layer 210, the first circuit pattern layer P1 and the electronic component 10.

As described above, the first build-up insulating layer 220 may be formed only on the inorganic material insulating layer 210 or only under the inorganic material insulating layer 210.

Here, the second circuit pattern layer P2 may be formed on the surface of the first build-up insulating layer 220, and the second circuit pattern layer P2 may be electrically connected to the first circuit pattern layer P1 and the external electrode 11 via a first via V1.

The process of implementing the circuit pattern on the first build-up insulating layer 220 formed of the organic material has high process efficiency and a fine circuit pattern in comparison with the process of implementing the circuit pattern on the inorganic material insulating layer 210. In addition, in processing the via passing through the insulating layer, fine vias can be relatively easily and precisely formed.

In addition, according to the necessity, at least one build-up layer may be further formed on the first build-up insulating layer 220. Here, the build-up layer may include a build-up insulating layer and a circuit pattern layer formed on a surface of the build-up insulating layer.

As shown in FIG. 2, which illustrates another embodiment of the present invention, a second build-up insulating layer 230, a third circuit pattern layer P3, a third build-up insulating layer 240, a fourth circuit pattern layer P4, and so on, may be further provided in an upward direction of the inorganic material insulating layer 210, and build-up layers may be further provided in a downward direction of the inorganic material insulating layer 210 in a similar manner.

In addition, as shown, it will be apparent that a solder resist SR and a solder ball SB may be further provided at the outermost side of the circuit board 100.

Accordingly, the circuit board 200 can effectively implement the fine circuit pattern on the first build-up insulating layer 220 formed of the organic material while sufficiently reducing the warpage using the inorganic material insulating layer 210.

FIGS. 3A to 3D are process cross-sectional views schematically showing a method of manufacturing the circuit board 200 according to the aforementioned embodiment of the present invention.

First, referring to FIG. 3A, an inorganic material 210' formed of glass is pre-treated to prepare the inorganic material insulating layer 210. Here, the pre-treatment may be a process of treating surface through a process such as surface etching, or the like, or a process of hardening the surface to further improve strength thereof.

In addition, in inspecting whether the circuit pattern is appropriately formed in the manufacturing process of the circuit board 200, when the inorganic material insulating layer 210 is transparent, efficiency and precision of the inspection of the circuit pattern disposed on the inorganic material insulating layer 210 may be decreased by the circuit pattern or the like disposed under the inorganic material insulating layer 210. In order to solve the problem, the inorganic material insulating layer 210 may be opaquely treated, and the opaque treatment may also be included in the pre-treatment process.

Meanwhile, the first circuit pattern layers P1 may be formed on the surface of the inorganic material insulating layer 210. Here, the first circuit pattern layer P1 may be formed at both surfaces of the inorganic material insulating layer 210, and a through-via Vt may be formed to electrically connect the first circuit pattern layers P1, P1' formed on both surfaces thereof.

That is, after processing a via-hole passing through the inorganic material insulating layer 210 by laser or wet etching, a conductive material may be provided in the via-hole to form the through-via Vt, and the first circuit pattern layers P1, P1' can be electrically connected by the through-via Vt.

Next, referring to FIG. 3B, the recess section 211 may be formed on the inorganic material insulating layer 210.

First, a resist pattern PR configured to expose a region in which the recess section 211 is to be formed is formed on the inorganic material insulating layer 210. Here, the resist pattern PR may be a photo resist pattern, but not limited thereto.

Next, the wet etching is performed using etchant, and as a result, the recess section, which is partially recessed, may be formed in the inorganic material insulating layer 210.

Here, when the first circuit pattern layers P1 are formed on both surfaces of the inorganic material insulating layer 210, the resist pattern PR may be formed such that the resist pattern PR covers both of the first circuit pattern layers P1 to prevent damage to the first circuit pattern layers P1 due to the etchant.

Next, when the etching process is completed, all of the resist pattern PR can be removed to provide the recess section 211 in the inorganic material insulating layer 210.

Next, referring to FIG. 3C, the electronic component 10 is inserted into the recess section 211.

Here, the electronic component 10 can be relatively securely fixed by applying an adhesive agent 12 to a lower surface of the electronic component 10 or applying the adhesive agent 12 to the upper surface of the recess section 211 and then mounting the electronic component 10.

Next, a first build-up insulating layer 220 is formed, and a via-hole VH passing through the first build-up insulating layer 220 is formed at a place requiring via connection, for example, an upper region of the external electrode 11 of the electronic component 10 or the first circuit pattern layer P1, by laser or wet etching.

Next, the via-hole VH may be filled with a conductive material, and the second circuit pattern layer P2 may be formed on a surface of the first build-up insulating layer 220.

Next, referring to FIG. 3D, the plurality of build-up layers, the solder resist SR and the solder ball SB may be formed on the first build-up insulating layer 220 to manufacture the circuit board 200.

FIG. 4 is a cross-sectional view schematically showing a circuit board 300 according to another embodiment of the present invention.

Referring to FIG. 4, it will be appreciated that the number of build-up layers provided on the inorganic material insulating layer 210 is larger than that of the build-up layers provided under the inorganic material insulating layer 210.

For example, as shown, when the external electrode 11 of the electronic component 10 is formed in an upward direction of the inorganic material insulating layer 210, a more complicate interconnection should be formed on the electronic component 10, rather than under the electronic component 10.

Even in this case, since the inorganic material insulating layer 210 is symmetrically formed at upper and lower sides thereof to reduce the warpage in the conventional multi-layered substrate, the interconnection cannot be sufficiently formed on the electronic component 10 to increase an area of the substrate or add unnecessary layers under the electronic component 10, increasing a thickness of the substrate.

However, as described above, since the circuit board 300 according to the present invention can efficiently implement the fine circuit pattern on the first build-up insulating layer 220 formed of the organic material while sufficiently reducing the warpage using the inorganic material insulating layer 210, the number of build-up layers may be different on and under the inorganic material insulating layer 210 from each other, and thus, the problems of the conventional art can be solved.

FIG. 5 is a cross-sectional view schematically showing a circuit board 400 according to another embodiment of the present invention.

Referring to FIG. 5, it will be appreciated that the circuit board 400 according to the embodiment may include a cavity 412 instead of the recess section so that the electronic component 10 is inserted into the cavity 412.

FIG. 6 is a cross-sectional view schematically showing a circuit board 500 according to a another embodiment of the present invention.

Referring to FIG. 6, it will be described that the circuit board 500 according to the embodiment may include an inorganic material insulating layer constituted by a first inorganic material insulating layer 510, an adhesive layer 515 and a second inorganic material insulating layer 513.

That is, in a state in which a cavity 512 is formed in the first inorganic material insulating layer 510, the adhesive layer 515 can be adhered to a lower surface of the first inorganic material insulating layer 510, and in a state in which the electronic component 10 is inserted into the cavity 512 of the first inorganic material insulating layer 510, the lower surface of the electronic component 10 can be securely adhered to the upper surface of the adhesive layer 515.

In addition, as the second inorganic material insulating layer 513 is further adhered to the lower surface of the adhesive layer 515, strength of the inorganic material insulating layer can be further improved to more stably support the electronic component 10.

Meanwhile, the first inorganic material insulating layer 510 and the second inorganic material insulating layer 513 are entitled merely for the convenience of description, the first inorganic material insulating layer 510 may be referred to as an inorganic material insulating layer, and the second inorganic material insulating layer 513 may be referred to as an added inorganic material insulating layer.

FIG. 7 is a cross-sectional view schematically showing a circuit board 600 according to another embodiment of the present invention.

Referring to FIG. 7, it will be appreciated that an electronic component 20 inserted into a cavity 612 is a capacitor such as MLCC or the like.

When the capacitor is inserted in this manner, vias may be formed at the lower surface of an external electrode 21 as well as the upper surface of the external electrode 21 to be electrically connected to the build-up layers FIG. 8 is a cross-sectional view schematically showing a circuit board 700 according to another embodiment of the present invention.

Referring to FIG. 8, the circuit board 700 according to the embodiment may include an inorganic material insulating layer 210, an identification mark F, an electronic component 10, a first build-up insulating layer 220 and a second circuit pattern layer P2.

Here, similar to the above-mentioned embodiments, the inorganic material insulating layer 210 may be glass.

Meanwhile, when the first build-up insulating layers 220 are formed on and under the inorganic material insulating layer 210 and the second circuit pattern layers P2 are formed on and under the inorganic material insulating layer 210, the second circuit pattern layer P2 on the inorganic material insulating layer 210 may be needed to be connected to the second circuit pattern layer P2 under the inorganic material insulating layer 210.

In this case, the through-via Vt passing through the first build-up insulating layer 220 may be formed to electrically connect the second circuit pattern layers P2.

In addition, the through-via Vt formed at this time can pass through the identification mark F. That is, in forming the through-via Vt, in order to process the via-hole at a precise position, the identification mark F can be used as a kind of reference index.

In addition, the identification mark F may be used as a reference index in a process of forming the recess section 211 or the cavity in the inorganic material insulating layer 210, and may be used as a reference index in a process of mounting the electronic component 10.

Accordingly, precision in processing of the via-hole, processing of the recess section 211 or the cavity, and mounting of the electronic component 10 can be further improved.

Unlike the above-mentioned embodiments, in the embodiment, the first circuit pattern layer P1 is not formed on the surface of the inorganic material insulating layer 210.

In consideration of the current technique, in comparison with the process of forming the circuit pattern or the via in the insulating layer formed of the organic material, the process of forming the circuit pattern or the via on the surface of the inorganic material insulating layer 210 formed of glass has a relatively low yield or process efficiency.

Of course, while the thickness for forming at least two layers can be reduced by forming the first circuit pattern layer P1 on the surface of the inorganic material insulating layer 210, an effect according to formation of the first circuit pattern layer P1 could be diluted in consideration of the process efficiency and yield.

Accordingly, in consideration of the above-mentioned aspects, an appropriate one of the above-mentioned embodiment and the present embodiment may be applied to manufacture the circuit board.

Meanwhile, since the others related to the embodiment are similar to the above-mentioned embodiment, overlapping description will be omitted.

FIGS. 9A to 9D are cross-sectional process views schematically showing a method of manufacturing the circuit board 700 according to the embodiment illustrated in FIG. 8.

First, referring to FIG. 9A, the inorganic material 210' formed of glass is pre-treated to prepare the inorganic material insulating layer 210. Here, the pre-treatment may mean that the surface is treated through surface etching, hardened to improve strength thereof, or the inorganic material insulating layer 210 is opaquely treated.

Meanwhile, the identification mark F is provided at the circuit board 700 according to the embodiment of the present invention.

Here, the identification mark F may be used as a reference index in the process of forming the recess section 211 or the cavity in the inorganic material insulating layer 210, and it has been described that the identification mark F can be used s a reference index in the process of mounting the electronic component 10.

The identification mark F may have a groove shape or a protrusion shape, and in the specification, a method of forming the identification mark F in the protrusion shape will be described.

First, a film F' is formed on one surface of the inorganic material insulating layer 210 through sputtering or plating.

Next, the resist pattern PR configured to cover a portion at which the identification mark F is to be formed and expose the other portion is formed. Here, the resist pattern PR may be a photo resist pattern.

Next, after removing the exposed region through etching or the like, the resist pattern PR may be removed to form the identification mark F having the protrusion shape.

Next, referring to FIG. 9B, the recess section 211 may be formed on the inorganic material insulating layer 210.

Further, the resist pattern PR configured to expose a region at which the recess section 211 is to be formed is formed on the inorganic material insulating layer 210. Here, the resist pattern PR may be the photo resist pattern PR, but not limited thereto.

Next, wet etching is performed using etchant, and as a result, the recess section 211, which is partially recessed, may be formed in the inorganic material insulating layer 210.

Next, when the etching is completed, all of the resist pattern PR may be removed to form the recess section 211 in the inorganic material insulating layer 210.

Meanwhile, a cavity instead of the recess section 211 may be formed in the inorganic material insulating layer 210, and as described above, the recess section 211 and the cavity may be formed through wet etching or laser drilling.

Here, a laser is irradiated to a predetermined region with respect to the identification mark F to form the recess section 211 or the cavity, more precisely processing the recess section 211 or the cavity.

Next, referring to FIG. 9C, the electronic component 10 is inserted into the recess section 211.

Here, after applying the adhesive agent 12 to the lower surface of the electronic component 10 or applying the adhesive agent 12 to the upper surface of the recess section 211, the electronic component 10 may be mounted to relatively securely fix the electronic component 10.

Next, the first build-up insulating layer 220 is formed, and the via-hole VH passing through the first build-up insulating layer 220 is formed in a place that requires via connection, for example, an upper region of the external electrode 11 of the electronic component 10, through laser or wet etching.

Meanwhile, when the second circuit pattern layers P2 are formed on and under the inorganic material insulating layer 210 and are needed to be electrically connected to each other, a via-hole passing through the first build-up insulating layer 220 and the inorganic material insulating layer 210 may be formed, and in order to precisely process the via-hole, the via-hole may pass through the identification mark F also.

That is, the identification mark F may be used as a reference index for processing the via-hole to form the through-via Vt.

Next, the via-hole may be filled with a conductive material, and the second circuit pattern layer P2 may be formed on a surface of the first build-up insulating layer 220.

Next, referring to FIG. 9D, a plurality of build-up layer, a solder resist SR and a solder ball SB may be formed on the first build-up insulating layer 220 to manufacture the circuit board 700.

As can be seen from the foregoing, the present invention includes the inorganic material insulating layer to provide useful effects of reducing the warpage in comparison with the conventional art, and effectively implementing the via and circuit pattern on the first build-up insulating layer formed of the organic material.

In addition, since the warpage can be sufficiently reduced, there is no need to symmetrically form the build-up layers formed on and under the inorganic material insulating layer, and thus, degree of design freedom can be increased and the circuit board can be further slimmed.

In addition, as the identification mark is used, precision in processing of the via-hole, processing of the recess section or the cavity, and mounting of the electronic component can be further improved.

As described above, although multiple embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A circuit board comprising:
   an inorganic material insulating layer comprising at least one of a cavity and a recess section, and comprising at least one of a glass sheet and a plate glass;
   build-up insulating layers respectively disposed on or under the inorganic material insulating layer, and comprising an organic material, wherein a number of build-up layers disposed on the inorganic material insulating layer is larger than a number of build-up layers disposed under the inorganic material insulating layer;
   a second circuit pattern layer disposed on a surface of the build-up insulating layer; and
   an electronic component partially inserted into at least one of the cavity and the recess section, and comprising an external electrode disposed at a surface thereof, wherein the external electrode is disposed in a direction in which the larger number of build-up insulating layers is disposed,
   wherein the inorganic material insulating layer does not comprise an epoxy.

2. The circuit board according to claim 1,
   wherein the second circuit pattern layer comprises a second upper circuit pattern layer disposed on an upper surface of a first upper build-up insulating layer disposed on the inorganic material insulating layer,
   wherein the circuit board further comprises a second lower circuit pattern layer disposed on an upper surface of a first lower build-up insulating layer disposed under the inorganic material insulating layer, and
   wherein the second upper circuit pattern layer and the second lower circuit pattern layer are electrically connected by a via passing through the build-up insulating layer and the inorganic material insulating layer.

3. The circuit board according to claim 2, further comprising:
   an identification mark disposed on a surface of the inorganic material insulating layer, wherein the via passes through the identification mark.

4. The circuit board according to claim 2, wherein the external electrode is electrically connected by the via to any one of the second upper circuit pattern layer and the second lower circuit pattern layer.

5. The circuit board according to claim 4, wherein the electronic component comprises a capacitor.

6. A circuit board comprising:
   a core substrate comprising at least one of a glass sheet and a plate glass, and at least one of a recess section and a cavity recessed from a first surface thereof;
   an electronic component at least partially inserted into at least one of the recess section and the cavity;
   build-up insulating layers, each comprising an organic material, and through which a via connects circuit patterns at opposite respective ends of the via, wherein a number of build-up layers disposed on the first surface of the core substrate is larger than a number of build-up layers disposed on a second surface of the core substrate, opposite to the first surface,
   wherein the core substrate does not comprise an epoxy.

7. The circuit board according to claim 6,
   wherein the circuit board further comprises:
   a first circuit pattern layer disposed on a side of a first build-up insulating layer disposed on the first surface of the core substrate;
   a second circuit pattern layer disposed on a side of a first build-up insulating layer disposed on the second surface of the core substrate; and
   a first via passing through the first build-up insulating layers and the core substrate, and electrically connecting the first and second circuit patterns:
   a third circuit pattern layer disposed on a side of the first build-up insulating layer disposed on the first surface of the core substrate;
   a fourth circuit pattern layer disposed on a side of the first build-up insulating layer disposed on the second surface of the core substrate;
   a second via passing through the first build-up insulating layers and the core substrate, and electrically connecting the third and fourth circuit patterns; and
   a third via passing through the core substrate electrically connecting the first and third circuit pattern layers.

8. The circuit board according to claim 7, wherein the first and second build-up insulating layers are in contact with the core substrate.

* * * * *